US006347388B1

(12) United States Patent
Hollander

(10) Patent No.: US 6,347,388 B1
(45) Date of Patent: Feb. 12, 2002

(54) METHOD AND APPARATUS FOR TEST GENERATION DURING CIRCUIT DESIGN

(75) Inventor: Yoav Hollander, Quiriat Ono (IL)

(73) Assignee: Verisity Ltd., Yehud (IL)

( * ) Notice: Subject to any disclaimer, the term of this patent is extended or adjusted under 35 U.S.C. 154(b) by 0 days.

(21) Appl. No.: 09/668,001

(22) Filed: Sep. 21, 2000

Related U.S. Application Data

(63) Continuation of application No. 09/020,792, filed on Feb. 6, 1998
(60) Provisional application No. 60/048,755, filed on Jun. 3, 1997.

(51) Int. Cl.[7] .............................................. G01R 31/28

(52) U.S. Cl. ...................................................... 714/739
(58) Field of Search .......................... 714/33, 738, 741, 714/739

(56) References Cited

U.S. PATENT DOCUMENTS

| | | | | |
|---|---|---|---|---|
| 5,535,223 A | * | 7/1996 | Horstmann et al. | 714/741 |
| 5,729,554 A | * | 3/1998 | Weir et al. | 714/738 |
| 5,784,550 A | * | 7/1998 | Brockmann et al. | 714/33 |
| 5,831,998 A | * | 11/1998 | Ozmizrak | 714/741 |

OTHER PUBLICATIONS

Zhang et al. Functional Verification with Completely Self-Checking Test, IEEE, p. 2–9, Apr. 1997.*
Biswas et al. Functional Verification of the Superscalar SH–4 Microprocessor, IEEE, p. 115–120, Feb. 1997.*
Yim et al., Design Verification of Complex Microprocessors, IEEE, p. 441–448, Nov. 1996.*

* cited by examiner

*Primary Examiner*—Albert Decady
*Assistant Examiner*—Shelly A Chase
(74) *Attorney, Agent, or Firm*—Michael A. Glenn

(57) ABSTRACT

A method and apparatus are provided for functionally verifying an integrated circuit design. A hardware-oriented verification-specific object-oriented programming language is used to construct and customize verification tests. The language is extensible, and shaped to provide elements for stimulating and observing hardware device models. The invention is platform and simulator-independent, and is adapted for integration with Verilog, VHDL, and C functions. A modular system environment ensures interaction with any simulator through a unified system interface that supports multiple external types. A test generator module automatically creates verification tests from a functional description. A test suite can include any combination of statically and dynamically-generated tests. Directed generation constrains generated tests to specific functionalities. Test parameters are varied at any point during generation and random stability is supported. A checking module can perform any combination of static and dynamic checks. Incremental testing permits gradual development of test suites throughout the design development process. Customized reports of functional coverage statistics and cross coverage reports can be generated. A graphical user interface facilitates the debugging process. High-Level Verification Automation facilities, such as the ability to split and layer architecture and test files, are supported. Both verification environments and test suites can be reused.

10 Claims, 8 Drawing Sheets

METHOD AND APPARATUS FOR TEST GENERATION DURING CIRCUIT DESIGN

This is a continuation of application Ser. No 09/020,792, filed Feb. 6, 1998 which claims the benefit of U.S. Ser. No. 60/048,755 filed Jun. 3, 1997.

BACKGROUND OF THE INVENTION

1. Technical Field

The invention relates to testing electronic circuitry. More particularly, the invention relates to a method and apparatus for verification of such electronic circuitry in integrated circuits, boards, and systems.

2. Description of the Prior Art

Design verification is the process of determining whether a particular hardware and software combination, such as an integrated circuit (IC), exactly implements the requirements defined by the IC's specification. As IC designs become more complex, the likelihood of design errors increases. However, design verification also becomes increasingly difficult and time consuming.

A typical prior art design verification scheme is devised in accordance with the device's specifications. A comprehensive test plan for the design is then devised and implemented. The verification scheme and test plan are usually both device-specific, and must therefore be revised or generated anew for each device to be tested.

Verification of a device under testing (DUT) frequently requires the DUT to be tested through integration cycles, as well as through specification changes. Additionally, the tester must determine the coverage of a test, for example, between subsystem and full-system verification, to determine if the testing is to be continued or has already been completed.

Verification testing may be performed on the actual device, or on a simulation model of the device. For purposes of explanation only, the following discussion will be limited to simulation models.

As systems become larger and more complicated, functional verification consumes a larger percentage of engineering resources. Furthermore, the prior art verification tools do not achieve the same level of abstraction as the design specification used for verification. Thus, the test generation tools may not allow the use of the abstract data types required to model a design.

Hardware Description Languages (HDLs) such as Verilog and VHDL are used to verify a design through the comparison of at least two design representations. Low-level netlists also perform a similar type of verification procedure. In this procedure, HDL and Netlist views of a design are simulated. Input stimuli to the simulator can come from a variety of sources. Checking is done by comparing results or behavior with the expected results that are either concluded by the designer or computed by a predictor simulator.

HDLs are designed to describe hardware at higher levels of abstraction than gates or transistors. However, such HDLs are typically not designed for verification. Thus, a verification engineer must often design a verification testbench that includes interfaced HDL programming, C or C++ programming, and various scripts.

In a system-level simulation approach, a designer builds a hierarchical, modular model of the entire device system. Test vectors are then developed to verify the functionality of the system. A test vector is a string of binary digits that is applied to an input of a circuit. The test vector is used to compare the circuit's output to the expected results.

In the prior art, the solution to increasing verification productivity has been to introduce increasingly faster simulators. Modeling and simulation can be accelerated through use of, for example, hardware modelers, commercial bus-functional models, simulator accelerators, and Field Programmable Gate Array (FPGA)-based Application Specific Integrated Circuit (ASIC) emulators.

However, the prior art mechanisms have not adequately addressed the reduction of verification development time. Verification engineers are still needed to write functional tests, develop diagnostic suites, determine test coverage, and analyze the results.

Verification engineers typically use combinations of deterministic, static, and dynamic tests to construct testing tools. In deterministic testing, each test is developed, checked, and executed manually. While some level of automation can be introduced into the testing process, deterministic testing still generally requires significant efforts of skilled personnel.

Deterministic tests are usually design-specific. Therefore, re-use of such a verification procedure is difficult, if not impossible. With the time, cost, and personnel constraints imposed by current marketing conditions, functional coverage by means of deterministic testing alone is usually low.

A static testbench is a program that drives pre-computed test vectors into the DUT simulator, and/or checks outputs after the simulation is completed. Such static testbench is frequently used to increase functional coverage during design development. A static testbench can include elements such as HDL Behavioral Functional Models (BFMs), monitors, and memories, as well as random test generators and post-run-checkers.

Generally, a static testbench is used to check the results of a test after the test has been completed. Thus, an error in the test is not detected until after the test is finished. As a result, the internal state of the device at the point of the error is not determined. To analyze signals and register states, the test must be re-run to the point at which the error occurred. This procedure consumes simulation cycles, and can require the expenditure of considerable time, especially during long tests.

A static testbench usually requires as least as much, and frequently twice the amount of code as the HDL model to which it is applied. The static testbench code is difficult to manage and control. Additionally, a static testbench is almost completely design-specific, and contains fixed code, written for one design. Thus, a static testbench is rarely re-usable for a next-generation design.

Parameter-driven test generation can be used to overcome the limitations of a static testbench. In this procedure, a program is written, for example in the C language, to generate test vectors. These test vectors are stored to a memory storage device, such as a hard drive, prior to the commencement of the test. C code is versatile and allows the creation of functions that can be reused for different device designs.

Parameter-driven test generation allows directed random generation. For example, a directed random generator can be used to test a communications device by creating large numbers of test packets meeting known parameters.

Parameter-driven test generation can support a low level of interaction with the HDL model. This is because the test program can be directed to send new stimuli to the simulator only after the occurrence of particular events. However, parameter-driven test generation is static. Thus, parameter-driven test generation cannot shape such stimuli in response to a model's state. It is therefore often difficult to generate exactly the correct stimulus to bring about the required state of the device for design errors detection.

For example, in certain memory controllers, a write to the master Direct Memory Access (DMA) count register should abort the current transaction. However, using a static procedure, it is extremely difficult to generate a test to verify that this will happen even if the write occurs in the last clock cycle of the current transaction.

A program that generates test vectors in concurrence with the DUT simulation and while being controlled by the state feedback of the simulated device is known as a dynamic testbench. A dynamic testbench can therefore be used to shape test vectors in response to device states. In such dynamic testbench, the test programs interact with the HDL model through an Application Program Interface (API) supported by the underlying simulator.

However, the implementation of such API is not a simple task. API implementation can differ among simulators. For example, each VHDL simulator has a different API. While Verilog uses a standard Procedural Language Interface (PLI), the interface is not always the same, especially between event-driven and cycle-based simulators. Additionally, if more than one simulator is used, such as a cycle-based simulator at the RTL level and an event-driven simulator at the gate level, several such interfaces must be developed.

The API permits direct function calls to be made from a dynamic testbench to the HDL model. These function calls can drive or sample the device model's input and output (I/O). After the occurrence of any event, the dynamic testbench code can use information sampled from the device model to shape the next set of stimuli applied to the model.

A dynamic testbench is used to advantage in verifying the functionality of events that occur at indeterminate times. Thus, a dynamic testbench can monitor a DMA operation and write a new value to the DMA count register in its last clock cycle, to verify that the current transaction is aborted.

There are several known disadvantages associated with the prior art dynamic testbenches. Such testbenches can be expensive to develop and maintain. Development time for a dynamic testbench can occasionally approach several months. Furthermore, dynamic testbenches are generally architecture-specific and parameter-driven.

In the prior art, procedures such as toggle testing and code coverage have been used to determine functional coverage. Toggle testing indicates the number of gates and flip-flops that are touched by a test. However, toggle testing does not indicate whether a test covers all system states.

Code coverage indicates how many lines of code in an HDL model are executed. Many different functions in a design can activate the same flip-flop or line of code. However, code coverage does not indicate whether all such conditions have been tested. Additionally, toggle testing and code coverage cannot detect any omitted functionalities. Therefore, it is difficult, if not impossible, to provide complete functional coverage using these prior art procedures.

Device functions must often be tested with regard to a hardware apparatus, such as the design of a chip or board that is under the control of a central processing unit (CPU). In such case, the CPU is not a part of the DUT, but the CPU can run certain programs that invoke the DUT. Examples of such scenario include:

a driver program in C programming language controlling an ATM switch;

the software of an answering machine controlling the answering machine chip(s); and a C diagnostic program checking an MPEG compression board.

The DUT design is verified by running the software against the hardware. However, it can be desirable to perform such verification tests while the hardware is still in simulation phase. One method for verifying the DUT with regard to a hardware apparatus is to use a cycle-accurate model of the CPU on which the software is to run. This model can be a hardware model, or can be simulated in Verilog, or C.

The code for the CPU model is compiled and loaded into, for example, a Verilog memory. The model then executes the compiled code while simultaneously running the DUT. However, this process is time consuming, and is subject to compiling and configuration errors.

Formal verification is a process for statically checking a model to determine whether the model is an accurate representation of a DUT. Thus, no simulation is run in a formal verification procedure. A formal verification tool usually first reads a gate-level or register transfer level (RTL) model and subsequently reads assertions in the verification tool's language. The formal verification tool then verifies whether the given model obeys the assertions. However, because a verification tool's language is typically not standardized, and can be difficult to use, formal verification is frequently a complex process.

Additionally, formal verification techniques are subject to a state explosion problem. This problem can occur when the necessary representation of the DUT logic consumes too much memory, thereby preventing the formal verification process.

It would therefore be an advantage to provide an automatic an dynamic verification method and apparatus that is reusable for all applications. It would be a further advantage if such method and apparatus reduced test development time. It would be yet another advantage if such method and apparatus facilitated the creation and verification of hardware models.

SUMMARY OF THE INVENTION

The invention provides a method and apparatus for functionally verifying an integrated circuit design. The invention uses a verification-specific object-oriented programming language to verify a device under testing (DUT). Such devices can include modules, chips, simulations, and systems, including systems having embedded software. A testbench created using the invention can be reused to test a device during each stage of design development.

The invention is adapted for integration with Verilog, VHDL, and C functions. A modular system environment ensures interaction with any supported simulator through a unified system interface that supports multiple external types. The unified system interface can also be adapted for custom modeling environments.

A hardware-oriented verification-specific object-oriented programming language is used to construct and customize the verification tests. The structure and components of this language are shaped to provide those elements needed to stimulate and observe a model of a hardware device. The verification-specific object-oriented programming language is extensible, allowing for incremental development and patching.

The invention includes a test generator module for automatically creating a device verification test from a functional description. The test generator can be constrained to generate tests for specific subsets of the design's functionality. Thus, some tests can focus on a specific feature in the design, while other tests can address broader functional scopes. The invention can also be provided with extensions to perform optional testing, such as co-verification or formal verification of a simulation model.

A test suite designed by the invention can include any combination of statically and dynamically-generated tests. The user has full control of the random generation process and can vary the test parameters at any point throughout the test generation.

The invention supports random stability. Thus, a change in a local constraint generally has a local effect on test generation, while the rest of the test is unaffected. The random number generator is both platform and simulator-independent.

Data checks are performed to verify the relation among different data elements, or to verify data against a high level reference model. The invention can perform any combination of static and dynamic checks. When using both dynamic generation and dynamic checking, the test generator module and the checker can constantly synchronize. Thus, temporal checks can be precisely targeted.

Incremental testing permits the gradual development of test suites throughout the design development process. The invention can be used in architectural modeling and for module verification. Additionally, known bugs can be intentionally bypassed to permit verification of other device functions.

The invention provides reports of functional coverage statistics at the architectural, module, or system levels. Cross coverage reports can also be generated for later analysis.

The invention includes a graphical user interface (GUI) that facilitates the verification process. The GUI permits the user to direct and control the invention, as well as to view the status of a testing procedure.

A source level debugger uses a debugging GUI that enables debugging with a data input device, such as a mouse or pointer device. Hyperlinks to related elements can be provided. Data structures, lists of events, and their interrelations can be displayed for interactive debugging by the user. The user can set breakpoints in the hardware-oriented verification-specific object-oriented programming language code, and can observe and change variable values inside both the verification-specific object-oriented language and the HDL code. The user can also use the invention to generate customized reports detailing the debugging process.

The invention supports High-Level Verification Automation (HLVA) facilities, such as the ability to split and layer architecture and test files. Thus, the invention can reuse both verification environments and test suites. Such recycling can reduce the time expended in verification and therefore increase productivity.

DETAILED DESCRIPTION OF THE INVENTION

The invention provides a method and apparatus for functionally verifying a design of a device. The invention is primarily directed to functional verification, and runtime verification with simulation.

Design verification is the process of checking that a design functions according to its specification. The invention provides an integrated method and apparatus for all aspects of design verification. The verification methodology implemented by the invention can be defined by the user. Thus, the invention can be used for test generation, checking and prediction of device functions, such as data and protocol related checks, and to provide coverage analysis. Additionally, the invention can be used to generate reference models and peripheral bus models of a design.

The preferred embodiment of the invention is optimized for use with an extensible, hardware-oriented verification-specific object oriented programming language. However, the invention is readily adapted for use with any programming language. Thus, the following discussion is provided for purposes of example and not as a limitation on the scope of the invention.

The invention's modular system environment ensures interaction with any simulator through a unified system interface. This unified system interface supports multiple external types. Therefore, the invention is adapted for seamless integration with HDL simulators, such as Verilog and VHDL simulators.

The unified system interface can also be adapted for custom modeling environments. In addition, the invention is readily linked with existing code or models, such as in the C, C++, Verilog, and VHDL languages. Furthermore, the invention can be adapted for use in testing an actual hardware device.

The invention uses built-in methods to support such features as test generation, checking, and reporting. These built-in methods can be modified or replaced to customize the testing environment.

A wide range of design environments can be tested using the invention. For example, the invention can be used to test a device under testing (DUT) such as modules, chips, simulations, and application specific integrated circuits (ASICs), as well as complete systems, including systems having embedded logic. The invention is also operable with cycle-based and event-driven simulation environments. A testbench created using the invention can be reused to test a device during each stage of design development.

Figure 1:
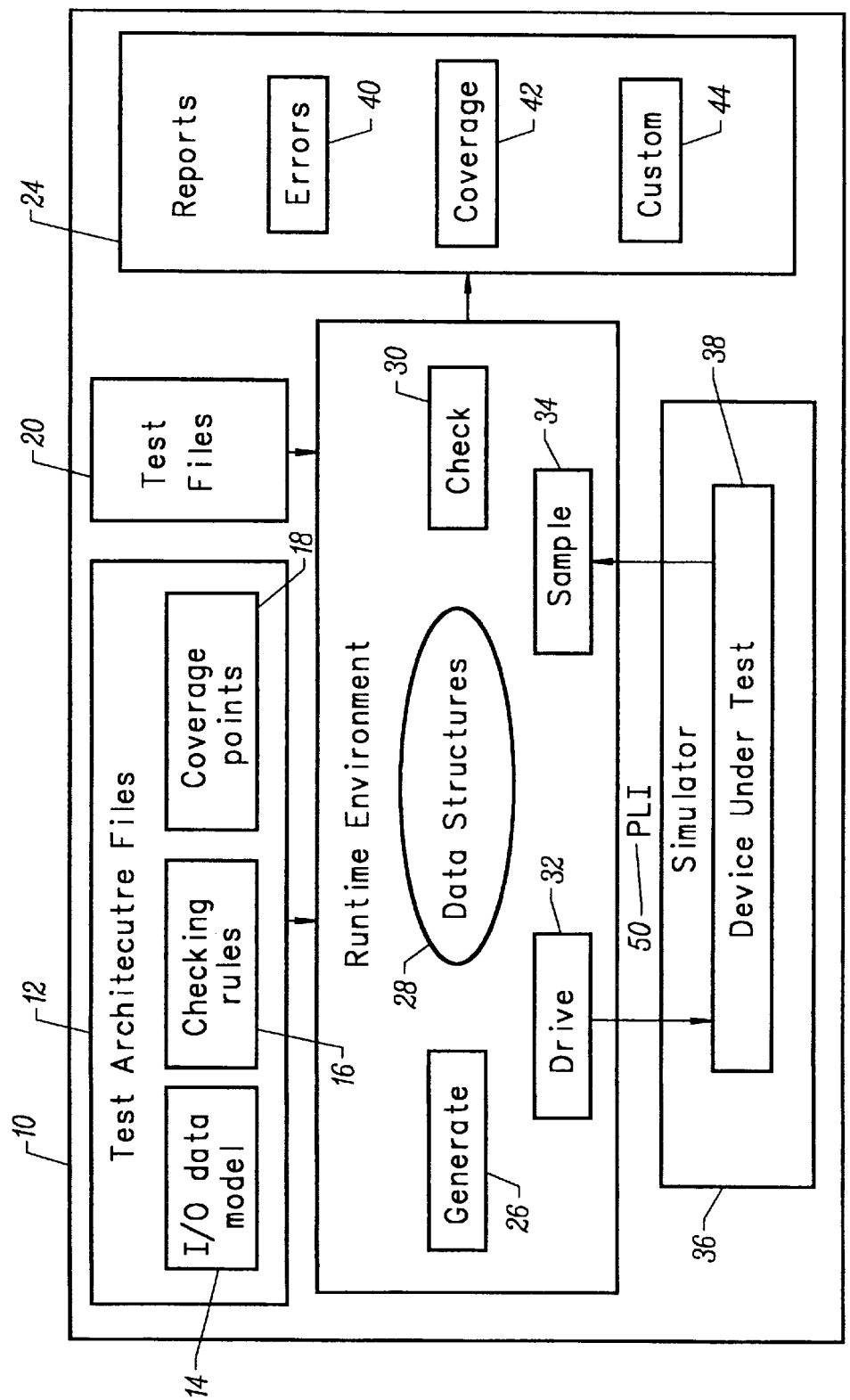
FIG. 1 is a block diagram of the system architecture of an apparatus for test generation according to the invention.

FIG. 1 is a block diagram of the system architecture of an apparatus 10 for test generation according to the invention. The device under testing (DUT) 38 illustrated in FIG. 1 is a Verilog simulator 36 using a Procedural Language Interface (PLI) 50. However, the discussion herein is equally applicable to other types of simulators, such as a VHDL simulator. Tests generated by the invention can be run against a register transfer level (RTL) or gate-level simulation of the DUT.

The invention integrates an architectural description of the DUT with abstract test generation and analysis. In the preferred embodiment of the invention, test architecture files 12 are created using the hardware-oriented verification-specific object-oriented programming language. An input/output (I/O) data model 14, is defined, as are files for checking rules 16 and relevant coverage parameters 18. Test description files 20 are also created. The invention's runtime environment 22 then applies specific patterns to the DUT. Reports and coverage information are collected during runtime, according to the specifications in the input.

The invention includes a test generator module 26 for automatically creating a device verification test from a functional description. The test generator interacts with, for example, the variables of an HDL model or design. The test generator can create random instances of data structures 28 such as ports and packets, if so defined in the architecture. Furthermore, the test generator can receive state information from the DUT and change the generation scheme, for example, the random distribution, in accordance with this state information.

A test suite designed with the invention can include any combination of statically and dynamically-generated tests, as well as deterministic and random tests. The user has full control of the random generation process and can vary the test parameters at any point throughout the test generation.

The test generator can be constrained to generate tests for specific subsets of the design's functionality. Thus, some tests can focus on a specific feature in the design, while other tests can address broader functional scopes.

The invention supports random stability. Thus, a change in a local constraint will generally have a local effect on test generation, while the rest of the test is unaffected. The random number generator is both platform and simulator-independent.

The hardware-oriented verification-specific object-oriented programming language is used to construct and customize the verification tests. The structure and components of this language are shaped to provide those elements needed to stimulate and observe a model of a hardware device. The verification-specific object-oriented programming language provides reusable, extensible code, allowing for incremental development and patching.

In the hardware-oriented verification-specific object-oriented programming language, data modeling is based on object definition, with the ability for the user to extend objects and define interdependencies using constraints. An object is defined as a set of data elements and associated operations, called methods.

The invention also uses compound object structures. All input and output data to and from the DUT can be specified as compound object structures. An ordered set of data elements, each of different size and type, can readily be constructed using such compound object structures. Compound object structures can be extended, for example, to include additional fields.

The compound object structure construct is used to define object types. Once a type has been defined, instances of that type can be generated. The invention's built-in test generator automatically generates instances during the test generation process, and assigns random values to the instances' data fields.

Methods are object-related functions that can be defined and extended or replaced. Such extensions can be made conditional, if desired. These extension features permit the re-use of code, for example, to test a next-generation design.

Thus, functionality can be modified, without the need to edit the original definitions.

The hardware-oriented verification-specific object-oriented language is extensible. For example, a definition of a core can be made in one file. For each application specific integrated circuit (ASIC) containing the core, additional files can be made, with each specific ASIC's added functionality overlaid on top of the original file. Thus, verification systems can readily be formed for multiple ASICs.

The higher, object-oriented, abstraction level of this modular code structure facilitates faster test development. Testing can therefore be performed early in the design cycle.

The invention permits the user to drive 32 or sample 34 any node in the design. Tests can be generated and expected responses can be computed in advance. The expected results are compared with the DUT output after the test is simulated.

Tests can also be dynamically generated, changing in response to the simulated state of the device. Alternatively, both pre-simulated and dynamically generated tests can be included in a testing procedure. The results of such tests are returned to the runtime environment for analysis and reporting.

The runtime environment uses a checker module 30 to verify the design of the DUT. Data checks are performed to verify the relation among different data elements, or to verify data against a high level reference model. The invention can perform any combination of static and dynamic checks. When using both dynamic generation and dynamic checking, the test generator module and the checker can constantly synchronize. Thus, temporal checks can be precisely targeted.

Incremental testing permits the gradual development of test suites throughout the design development process. The invention can therefore be used to advantage in architectural modeling and for module verification. Additionally, known bugs can be intentionally bypassed to permit verification of other device functions.

A report generator module 24 provides textual and graphical information on the test results. The invention provides reports of functional coverage statistics at the architectural, module, or system levels. These reports can include error reports 40, and coverage reports 42, as well as custom report 44 configurations. Cross coverage reports can also be generated for later analysis. The analysis in the coverage reports is used to increase testing effectiveness by providing the user with information to locate gaps in the verification process.

Cross coverage reports the correlation between multiple coverage points. While each coverage point shows the distribution of occurrences as a one dimensional histogram, the cross coverage shows the distribution of occurrences in a multi-dimensional space, where each dimension is one of the crossed coverage points. The correlating reference may be defined per cross coverage operation. The reference can be, for example, the time of occurrence, an occurrence within an interval of time, or the order of occurrence.

Cross coverage is capable of revealing holes (cases that where never tested) which are obscured by their component coverage points. For example, crossing color and shape might reveal that a "red ball" never occurred, while all colors and all shapes have occurred (but obviously not all the combinations of colors and shapes—as only the cross coverage can show).

Cross coverage provides a unique way to conduct a detailed analysis of the effectiveness of the verification effort.

Figure 2:
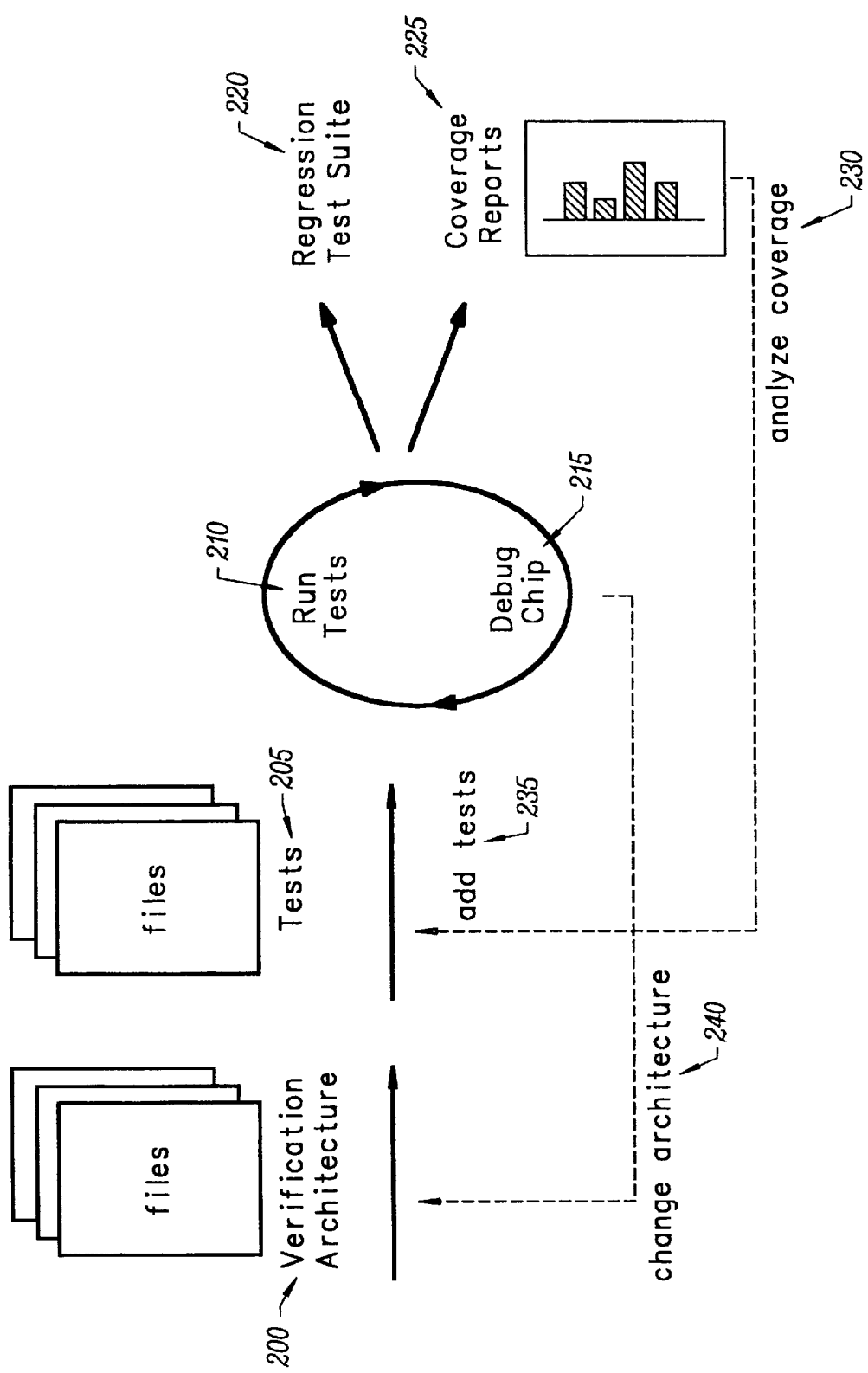
FIG. 2 is a flow diagram of a test generation procedure according to the invention.

FIG. 2 is a flow diagram of a test generation procedure according to the invention. The invention's modular structure is used to advantage to increase the speed of the design verification process. The reusable and extendable code of the verification architecture (200) and the test files (205) is used to run tests (210) on the DUT.

The results of these tests are analyzed (230) and presented as coverage reports (225). Additional tests are created (235) by the test generator in accordance with the results of this analysis. In the presently preferred embodiment of the invention, such additional test generation requires additional user input. However, in alternative embodiments, no such additional user input is required. The analysis results are then used in debugging the DUT (215).

During development, the DUT design is typically changed. Some such changes can require corresponding changes in the verification architecture. A regression test suite (220) can be used to re-test previously-tested functionalities, assuring that no new integrated module corrupts the system.

The invention's error discovery and fix cycles are tightly coupled. Furthermore, the graphical user interface and debugger facilitate error location. (see FIGS. 4 and 5, below). Thus, the invention permits the user to locate, and thereafter correct, such design (240) prior to the expenditure of significant amounts of development time and funds.

Figure 3:
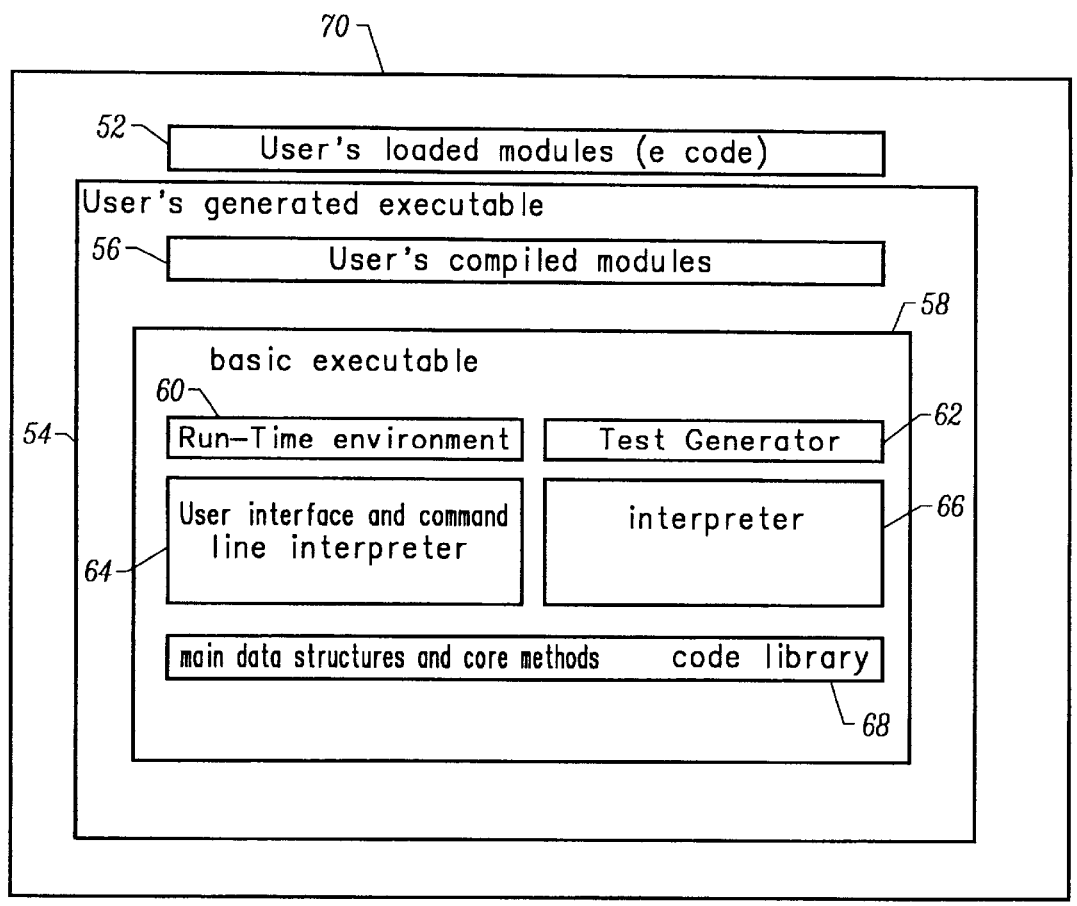
FIG. 3 is a diagram of the structure of an apparatus for test generation according to the invention.

FIG. 3 is a diagram of the structure of an apparatus for test generation 70 according to the invention. The invention is directed to perform a design verification by running an executable 54 that includes compiled system modules. The executable can be linked with user compiled modules 56 to produce a new executable. Running the executable invokes the invention, as extended by any definitions and declarations in the compiled user modules.

The basic executable 58 includes the runtime environment 60, test generator 62, and user interface and command line interpreter 64 modules. The basic executable also includes the code library 68 for the main data structures and core methods, as well as the interpreter 66 for the programming language.

After the executable is invoked, other user modules 52 can be loaded. In the preferred embodiment of the invention, modules are loaded such that the definitions in one module can extend, modify, or override definitions in a previously-activated module. An optional compile phase can be used to improve performance. In this phase, when a user is satisfied with the level of functionality, the hardware-oriented verification-specific object-oriented programming language code is compiled to generate a customized executable. Each customized executable can be used to develop a subsequent layer of functionality.

The invention is adapted to interface with most HDL simulators, such as Verilog and VHDL simulators. However, the invention can also function without an interface to a simulator. The invention's variables or expressions can be displayed with a third-party waveform display tool, and scripts can be called from within the simulator.

Figure 4:
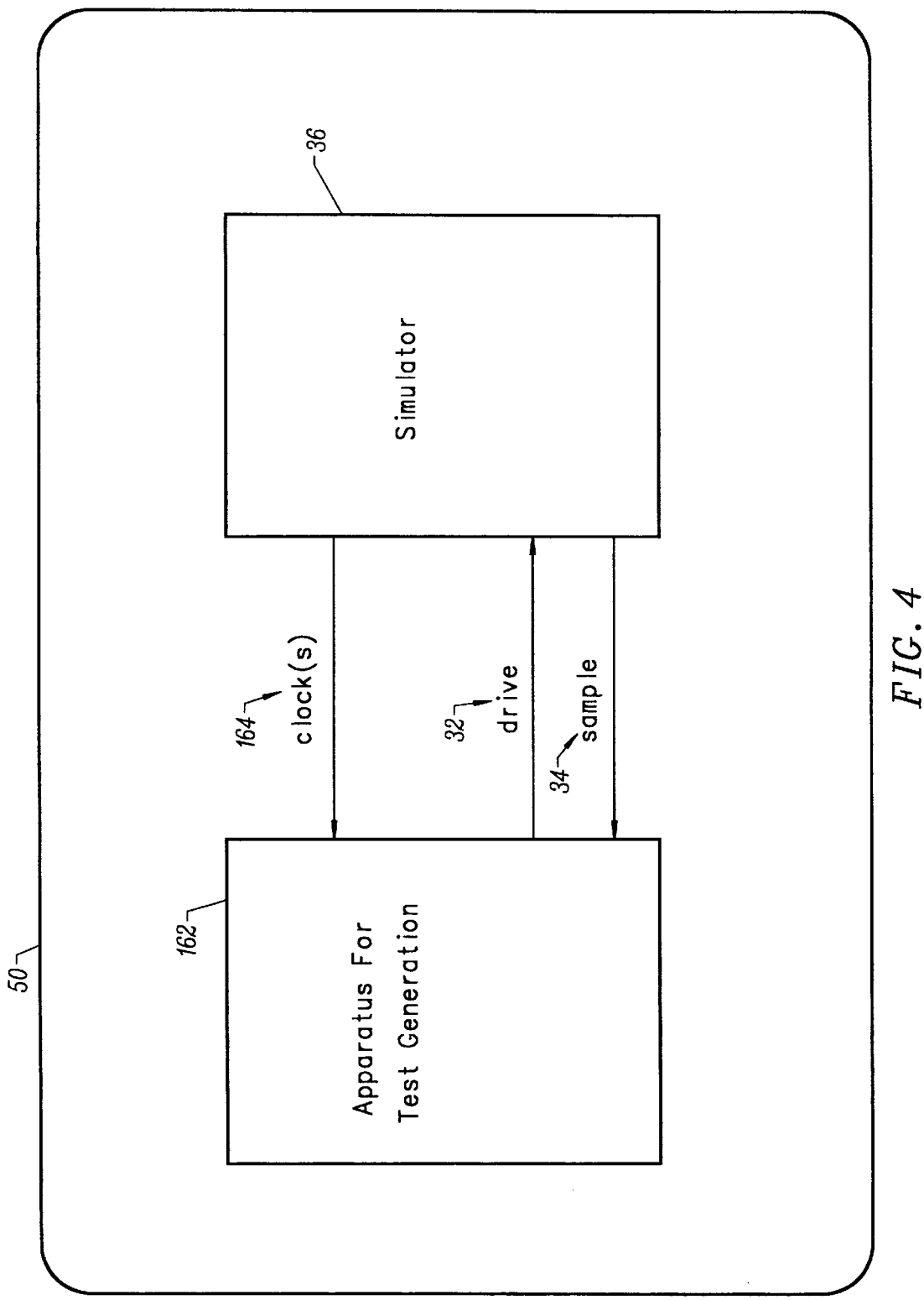
FIG. 4 is a diagram of a simulator interface of an apparatus for test generation according to the invention.

FIG. 4 is a diagram of a simulator interface 50 of an apparatus for test generation according to the invention. The invention 162 can drive 32 or sample 24 any simulator 36 signals. This can optionally be performed with time delays. Verilog tasks or VHDL procedures can also be called. The invention can read and use Verilog definitions, directly access Verilog variables, and can display coverage information for any Verilog/VHDL signal.

Additionally, the invention can be synchronized to one or more simulator clocks 164 or other systems. Thus, the invention is used to advantage in testing events that occur at specific times, or in particular clock cycles.

For example, a Verilog clock can be synchronized to the invention. In the preferred embodiment, the default resolution for accessing Verilog variables is one invocation of the invention per clock edge. However, the user can also increase this default time resolution.

Additionally, the user can specify delays when Verilog variables are driven or sampled, if the simulator is not cycle-based. The user can also specify how long such driven signals maintain their driving value.

Verilog tasks can be called from scripts written in the verification-specific object-oriented programming language. However, before Verilog tasks can be called, the tasks must be defined for the invention. Such Verilog tasks include zero delay tasks.

Figure 5:
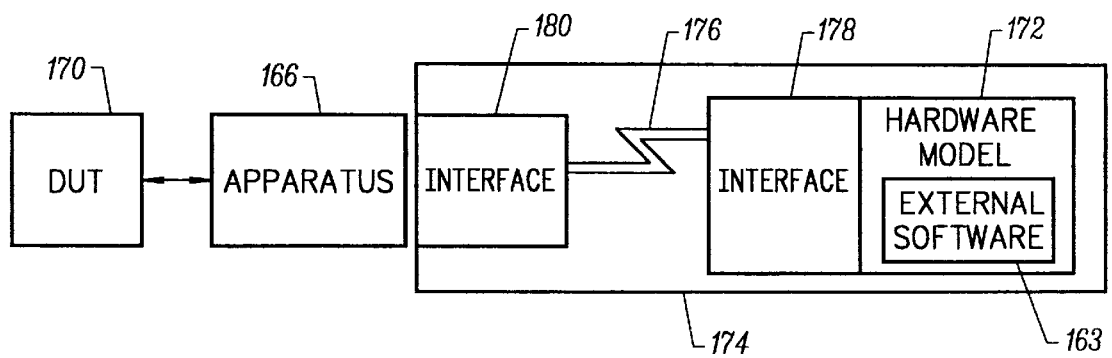
FIG. 5 is a diagram of a co-verification link configuration according to the invention.

The preferred embodiment of the invention can include extension modules for providing additional functions, such as co-verification, and formal verification for model checking. FIG. 5 is a diagram of a co-verification link configuration according to the invention. Alternative embodiments can include any, or none, of the extension modules.

To perform co-verification using the invention, the user first creates a cycle-accurate model of the hardware apparatus 172 on which the external software program 168 is to be run. This bus-functional-model can be, for example, a Verilog model, a C model, or a hardware model.

The model is in electronic communication with the invention, for example through a Unix socket 176. A first protocol software layer 178 is provided to interface the external software program to the invention, through the Unix socket.

The herein described apparatus 166 interfaces with a simulation, such as a Verilog model 170, of the DUT. A second protocol software layer 180 is provided as a link, through the Unix socket, between the invention (interfaced with the DUT simulation) and the external software program. The external software code is then compiled and executed by the hardware apparatus while the DUT simulation is run simultaneously. The two programs can be run, for example, in separate windows of a workstation.

The external program runs at full speed until it reaches pre-designated points at which the program interacts with the DUT. A co-verification request is then sent through the socket to the invention. The invention interprets the co-verification request, and executes the appropriate functions. The results are then returned to the external program, which then continues running until the next request is sent.

The co-verification extension module 174 is built on top of the herein described apparatus. One implication of this structure is that software verification is treated in the context of the full verification effort. Thus, test generation, checking, debugging, coverage, and reporting all combine information from both the hardware and the software sides. Additionally, the facilities of the invention can increase co-verification productivity.

For example, the invention's test generation facilities are available for both the direct inputs to the DUT and the inputs to the external software. Thus, one test can specify both, and all tests are readily repeatable. Furthermore, all tests can be controlled using the same transaction-based GUI generation facility.

The coverage facility can be used to create coverage displays for information gathered from the DUT and the external software. The invention's interpreter can permit the external software to request the execution of arbitrary commands during runtime. By debugging the co-verification script using the invention's source-level debugger, the user can see what happens the external program side in conjunction with what happens on the DUT side.

The extension facility permits the user to request that a specific operation be performed upon every interaction. The user can make this request before or during a test. By using the invention's record/replay facility, the user can record a long simulation and replay it relatively quickly. During the replay, the user can debug the external software.

The invention can interface with many types of simulators. All such simulators will also function with the co-verification extension module. Additionally, the user can begin use the invention to begin debugging, for example, driver software before Verilog code has been written. A simplistic hardware model can be written using the verification-specific object-oriented programming language. The co-verification extension module can then be used to drive the hardware model scripts. The scripts can later be replaced with Verilog code, with no need to change the external software.

If the DUT is already written in Verilog code but the external software is not completed, a read-and-write script can be created using the verification-specific object-oriented programming language. Testing of the DUT can then be commenced. The script can later be replaced when the external software is completed.

One example of co-verification according to the invention is the verification of an asynchronous transfer mode (ATM) driver program, written in C. To perform such co-verification, the user must provide a C routine interface to the external program, a script interface to the invention in the verification-specific object-oriented programming language, and a bus-functional-model for the CPU.

In this example, the driver program interacts with the ATM switch to read and write from internal registers. Assuming that the reads and writes are implemented using calls to C routines, the routines are changed to call an execute request routine directed to the invention. This request is synchronized with the invention through the Unix socket. The invention then calls a predefined script in response to the request.

In this co-verification procedure, the C program runs at full speed between synchronization points. Thus, a simulation using the co-verification extension module of the invention can be faster than one using the prior art cycle-accurate CPU model. The user can specify the amount of time, in simulated cycles, that is to pass between synchronization points of the simulator.

The listed types of co-verification requests can be expanded by the user. Such requests can include:

read and write operations;

interrupt requests from the DUT;

waiting for a deterministic (or random) number of cycles;

error messages from the external software to the invention;

logging and reporting requests;

coverage requests;

arbitrary commands to be executed by the invention's interpreter; and back-door generation requests (discussed below).

The co-verification extension module can be used in several different verification scenarios, including:

1. Connecting with external software that takes input from the DUT.

For example, the software can be read-only memory (ROM) software that controls the DUT, but all of whose inputs come from the DUT. Thus, only the DUT has external interfaces. In this case, the verification tests are generated by the invention, and the external software functions as an extension of the DUT, as if it were another module.

2. Connecting with external software that takes separate inputs.

The external software will frequently have its own dedicated inputs. For example, a driver package can interact with the DUT on one side, as directed by calls to the driver packages application programming interface (API) on another side. Thus, in a testing scenario, a user C program linked with the driver will call the driver's API routines.

The C program can prompt the user to select the next routine. In response thereto, the C program calls the appropriate driver routines. The co-verification procedure of the invention uses a process known as back-door generation. In this process, the invention is prompted to select the next routine, rather than the user. A script in the verification-specific object-oriented programming language is used to respond to this prompt.

Thus, the invention can be used to drive both the hardware and software components of the test. One test file can specify parameters for both the hardware and software. The test can readily be repeated with the same initial settings. Additionally, the invention permits the user to dynamically test combinations of commands.

3. Connecting with a program running on a different machine.

In this scenario, if the external software, such as a driver, is written in Visual C++ language on a personal computer, it can be run on the personal computer, even using the Visual C++ debugger. However, the external software is connected, using the co-verification extension module, to the invention and a simulator interfaced thereto. Sockets can readily be provided to different computing platforms.

4. Connecting with a golden model.

A golden model, for example, in C language, that is only accurate on a transaction-by-transaction level can be connected to the invention using the co-verification extension module. In such case, the C program issues a co-verification request at the end of each transaction for the invention to check various values for that transaction. The invention performs the requested check, reads the next request, and performs the next requested check.

5. Running a distributed test environment.

The invention can be used to control a plurality of personal computers or workstations that together constitute a network testing environment. Each computer can contain a copy of a design. The invention generates a test and uses the co-verification extension module to distribute to each computer a description of the computer's role. The invention then collects the test results, using the co-verification extension module.

6. Connecting to multiple instances of the simulator.

A distributed simulation can be run over several computers. In such case, an apparatus according to the invention is linked to each simulator. Co-verification extension modules are used to permit communication among these apparatuses.

7. Connecting to multiple instances of the same C program.

The structure of the verification-specific object-oriented programming language permits the user to run multiple instances of either the same, or different programs against one simulation. Each instance is connected through the co-verification extension module to the corresponding script of the invention.

8. Connecting to synthetic or real external data streams.

The co-verification extension module is also used to advantage to permit the user to connect to either synthetic or real external data streams.

While the preferred embodiment of the invention can interface with a co-verification extension module that is specifically designed for use with the invention, alternative embodiments of the invention can interface with commercially-available hardware/software co-design environments.

The invention can be used as a formal verification tool, using a formal verification extension module. In this embodiment of the invention, a temporal language is defined. A subset of scripts in the verification-specific object-oriented programming language, including a subset of the temporal language, are translated into Verilog or any logic description acceptable by a formal verification engine. The translation of the temporal assertions is controlled through the invention. The generated Verilog, or other acceptable, code is then communicated through an interface to an existing formal verifier, using a single assertion.

If the assertions are proven by the formal verification engine, the assertions are removed from the actual runtime. These proven assertions can later be indicated during check coverage reporting.

A formal verification tool usually first reads a gate-level or RTL model and subsequently reads assertions in the verification tool's language. The formal verification tool then verifies whether the given model obeys the assertions. However, the invention is used to advantage in formal verification because the verification tool's language is frequently difficult to use, and is not standardized.

Another advantage offered by the invention is that only part of the design is subject to formal verification. This part can be selected automatically by the invention. Because the memory required for storing the simulation is reduced, the likelihood of the occurrence of a state explosion problem, discussed above, is also reduced. One additional advantage provided by the invention is the integration of formal verification results into the coverage report generated by the invention.

Figure 6:
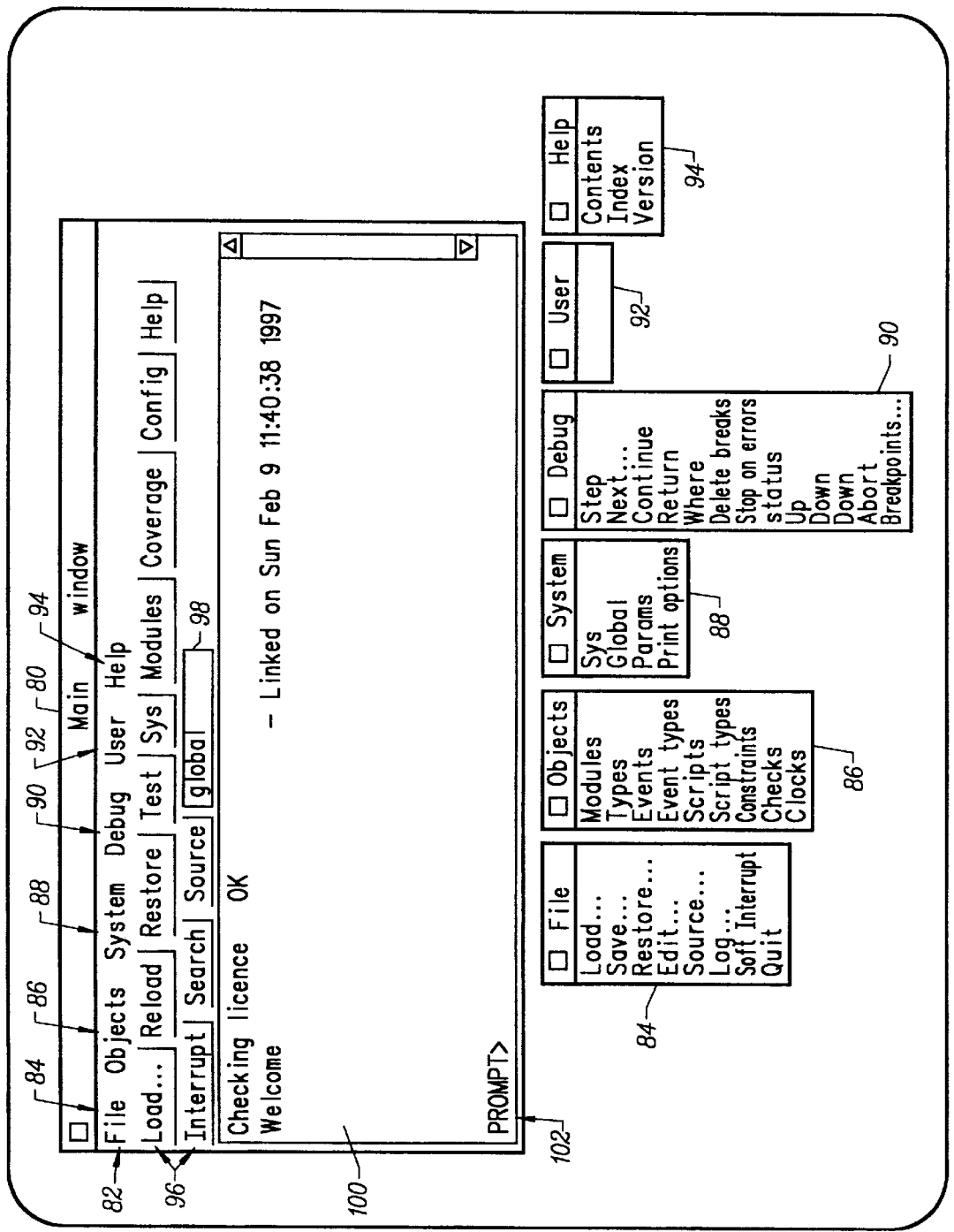
FIG. 6 is an exemplary graphical user interface of an apparatus for test generation according to the invention.

A graphical user interface (GUI) permits the user to direct and control the invention, as well as to view the status of a testing procedure. FIG. 6 is an exemplary graphical user interface 80 of an apparatus for test generation, according to the invention.

The display screens and configuration of the GUI described below are provided in accordance with the presently preferred embodiment of the invention. However, one skilled in the art will appreciate that such display screens and GUIs are readily modified to meet the requirements of alternative embodiments of the invention. The following discussion is therefore provided for purposes of example and not as a limitation on the scope of the invention.

The GUI can include a pull-down menu 82 with such listed categories as file 84, objects 86, system 88, debug 90, user 92, and help 94. In the preferred embodiment of the invention, all menus can be "torn off" and moved to different locations on the desktop.

Selectable command buttons 96 can also be provided for accessing various functions of the invention. For example, a button 97 can be provided for accessing Help functions. A text box 98 permits the user to type in, and select, text commands.

The progress of the testing procedure is displayed in a display window 100. This display can include, for example, the test generation process, or the generated input and result of a test performed upon the DUT. A command prompt 102 is also provided.

Figure 7:
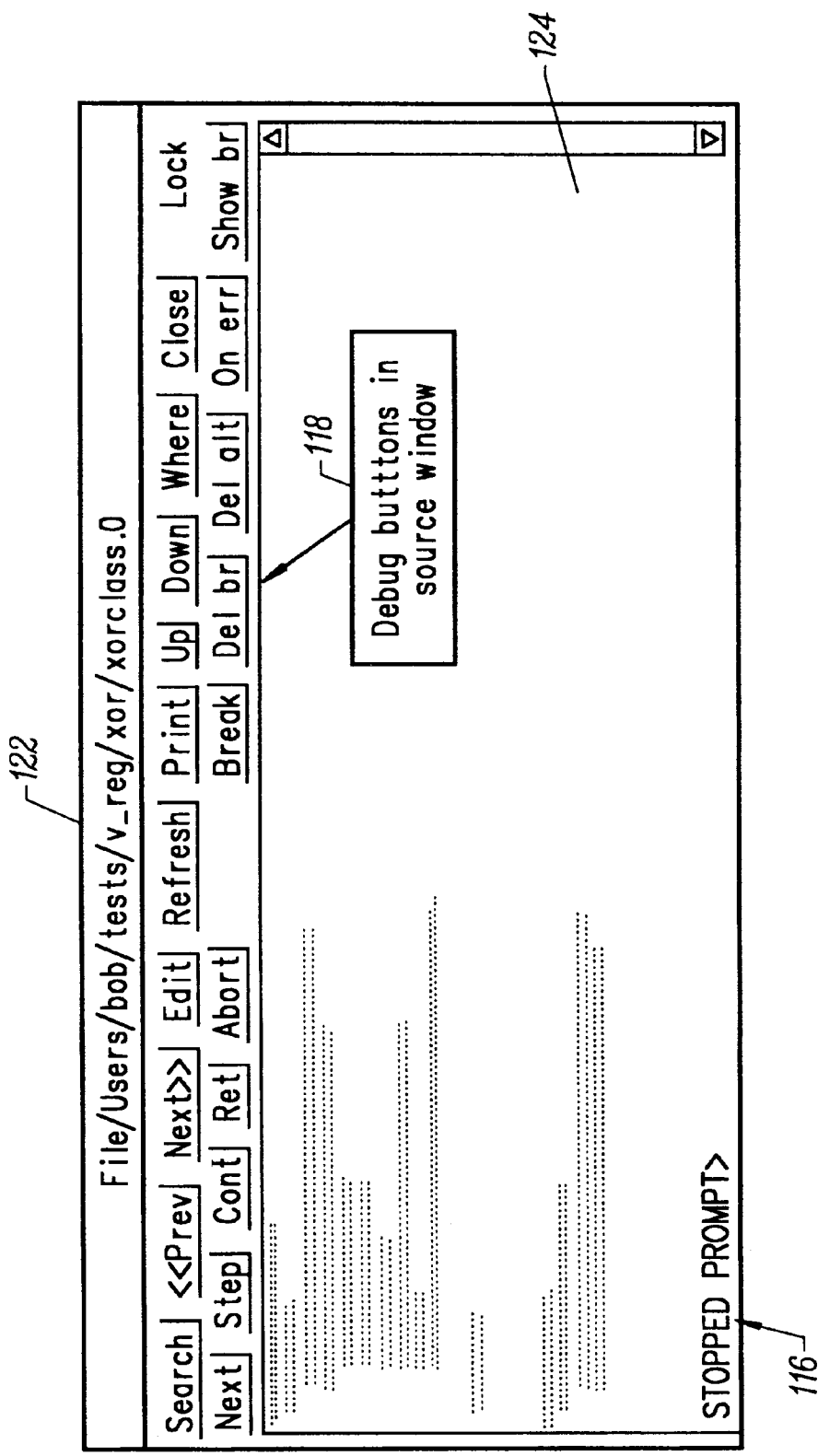
FIG. 7 is an exemplary debugging graphical user interface of an apparatus for test generation according to the invention.

A debugging GUI is used to facilitate the debugging process. FIG. 7 is an exemplary debugging graphical user interface 122 of an apparatus for test generation according to the invention.

A source level debugger enables debugging with a data input device, such as a mouse or pointer device. Customized reports detailing the debugging process can be, for example, shown in the display window 124, stored for later review, transmitted to another location, or printed.

Command buttons 118 for executing debug commands are displayed in the window 124. In the preferred embodiment, debugger commands can also be typed at the debugger command prompt 116. When the invention is in debug mode, the command prompt is stopped, to permit entry of such debugger commands.

Hyperlinks (not shown) to related elements can be provided. Data structures, lists of events, and their interrelations can be displayed for interactive debugging by the user. For example, the user can type directly into the display window to execute commands. Alternatively, the user can use other methods, such as the pull-down menu, command buttons, command prompt, command file, or keyboard commands to effect changes in the testing procedures.

Figure 8:
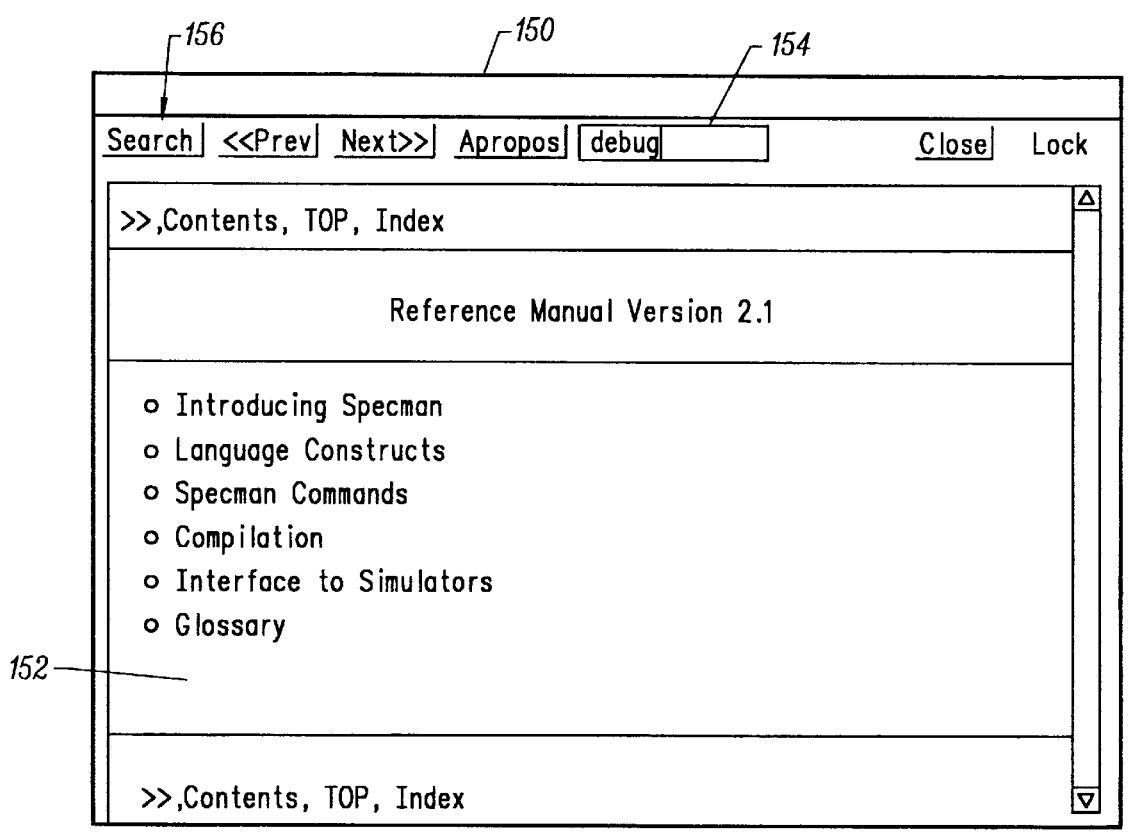
FIG. 8 is an exemplary help graphical user interface of an apparatus for test generation according to the invention.

Help for the invention can be accessed in several ways. FIG. 8 is an exemplary help graphical user interface 150 of an apparatus for test generation according to the invention. The help function can be accessed by such methods as typing a text command into the display window 152, typing a text command into the help text box 154, or by clicking on a help command button 156.

Alternatively, help information can be retrieved from an electronic network database. For example, a World Wide Web (Web) browser can be used to access help files from a database linked to a Web page.

Although the invention is described herein with reference to the preferred embodiment, one skilled in the art will readily appreciate that other applications may be substituted for those set forth herein without departing from the spirit and scope of the present invention.

For example, a preferred embodiment of the invention is the Specman system developed by Verisity Design, Inc. of Mountain View, Calif. In this embodiment, the term Specman refers to the apparatus, while the term Specview refers to the GUI. The verification-specific object-oriented programming language is known as e. The description of one version of a Specman system is included herein for purposes of example only and is not intended as a limitation upon the scope of the invention.

In the Specman system, an e file is considered a module. To run tests, all relevant e modules are either loaded onto, or compiled by Specman. A test command is then issued.

The e language has syntactic constructs specifically designed for writing testing environments, Such constructs include constraints to direct the generation of tests and data, checks and temporal assertions to verify that the DUT functioned correctly, and cover-points to collect statistical information of previously-run tests.

A Specman testing environment is typically based on a plurality of e modules. Each module can contain statements that define types and data-structures upon which tests will be based. A statement can contain a method for controlling the flow and timing of the tests.

In addition, to facilitate the incremental development of code, a module can extend or override definitions found in previous modules. A module can also include statements for defining time-related constructs such as events, clocks and scripts.

The e language includes various data-types, each associated with a set of supplied operations. These data-types include scalar types such as enumerated types and integer rangelists, list types, struct types, and strings. Syntactical restrictions are imposed to enforce consistent usage of data elements.

Scalar types in the e language include predefined scalar types, enumerated user-defined types, and types in which the size in bits of the type is explicitly specified. Appendices A–X, attached hereto and incorporated as a part of this application, further describe the features, functions, and structure of the invention. Appendix A is a description of scalar types supported by one embodiment of the invention.

The e language supports dynamic sub-typing through the usage of the "when" construct. Sub-typing is a relationship between objects, where one object, called the parent object, belongs to a particular type and another object, called the child object, belongs to a type that inherits from the said type. Object typing in prior art languages is always static, so that each created object is of a particular type. In contrast, object typing in e can be dynamic. An object can be created as a member of a particular type and later change its type, by changing one of its attributes, to become a member of a dynamic sub-type. Likewise, an object can be created as a member of a dynamic sub-type and later change its features to become a member of the super-type.

Dynamic sub-typing is helpful in the task of modeling behavior. Often, the creation of an object must happen in an ambiguous context. Later when the exact nature of the object is revealed, the type is adjusted to provide all the features of the actual object.

For example in a situation of a receiver, starting to receive a packet of data, it may be impossible to determine the exact type of the received packet. At that point, a generic packet object is allocated. Later, when the features of the received packet can be observed, the type may change, for instance to a control packet. As the type of the object changes dynamically it acquires access to more specific features. This transition is handled in prior art methods by some means of casting which are difficult to program and cumbersome in usage.

Furthermore, the generation of a dynamic type may result in Specman in any of its sub-types. A test may contain ambiguous objects of some type, which becomes a random sub-type during generation. This helps in abstracting the test and increases the expressibility of the test language.

Compound data structures are defined by struct statements. A struct definition is the fundamental data abstraction mechanism used to encapsulate data, data-relations, and procedural activity in one single entity. A struct is therefore also considered to be an object-oriented programming language class. Appendix B includes information regarding the definition and description of structs according to one embodiment of the invention.

Data is stored in the struct fields, declarative relations among these fields are specified in constraints and in conditional fields, and operational relations associated with these fields are defined in the methods of the struct. A concrete data element of a struct type is called an instance of that struct.

A field is a data component in a struct definition. Each field has a type, and a range of admissible values. The range of admissible values is derived from the type and from dependencies on other fields, specified by constraints. A field in a struct can be a struct itself.

A method is an operational procedure associated with a struct. A method's run time activation is executed in the context of a specified instance of that struct. Methods are usually used to manipulate or perform computations on the fields of the struct with which they are associated.

The extend mechanism is used to modify existing struct definitions. A struct can be extended by adding fields, methods and constraints to the struct. A struct can also be extended by modifying existing method definitions. Existing methods can be modified by adding actions to be executed before, after, or in lieu of the method body.

The extend mechanism is a unique form of object inheritance. An object is defined in the language using a struct declaration. At a later time, possibly in a different module (file), the definition of said object may be extended to include additional features, such as data fields, constraints, new and modified definition of methods. The new features become part of the previously defined type. In particular, any existing instances of that type are modified to reflect the type changes. The same type can be extended repeatedly, an unlimited number of times.

In particular, the extend mechanism provides a way to customize a pre-defined object, by adding features and modifying behavior, as a layer on top of the original definition. Prior art methods involve either editing the original object definition or using type inheritance, which is implemented in prior art object oriented languages (referred to as "like" inheritance). Editing prior definition code carries the risk of introducing errors into the already operational layer. Using "like" inheritance preserves the correctness of the original type, as in extend, but requires duplication of all the interacting object types.

The extend mechanism is useful in verification, where information about the DUT is provided incrementally, as the design process advances.

Actions are lines, within methods, that are used to carry out the actual programming activities. These actions are executable constructs used to manipulate data and control program flow. For example, actions can include variable definitions, assignments, if-then-else clauses, and for-loops. Methods are composed of actions and action-blocks. Actions generally appear in the body of a method. In addition, actions can be interactively typed at a Specman prompt. Appendix C describes basic actions according to one embodiment of the invention.

Print actions are used to display the contents of a data element. The printing of such data element is affected by:

the setting of a global struct that contains information governing the display of printing commands output;

the type of the data element;

various options and switches issued with the printing commands, and having a temporary effect during execution of the command; and standard print methods of the displayed element, whose definitions can be modified by the user.

Appendix D describes print actions according to one embodiment of the invention. Print actions are used to display the contents of data elements. The printing of such elements is affected by:

the setting of a global struct that contains information governing the display of printing commands output. This global struct can be modified to globally change these settings.

the type of data element.

options and switches issued with a printing commands and having a temporary effect during the execution of such command.

standard print methods of the displayed element. The definitions of such standard print methods can be modified by the user.

Actions are composed of expressions. An expression can be a literal value, a variable, or a compound expression constructed from several values and literals. Literals are number, character, and string values specified literally in the code. Appendix E describes the expressions supported by the e language according to one embodiment of the invention.

Operators are applied to literals to create compound expressions. Appendix F summarizes the e operators supported in one embodiment of the invention.

Lists are efficiently-implemented dynamic arrays. Specman supports a set of list operators that can be combined to create expressions. Appendix G describes the lists supported by one embodiment of the invention.

The e modules are divided into two categories: domain-descriptions and test-descriptions. Domain-descriptions specify the DUT interfaces and the protocols used by the DUT. Test-descriptions specify test data, such as the actual data to be driven as inputs to the DUT. An e construct can be placed in any of the e modules, because there are no syntactic limitations or differences between the two file categories.

The Specman system is used to generate, run, and analyze tests These tests are derived from test-descriptions, specifying test data, checks, and cover-points. Test-descriptions are organized in modules, written in e language. Test data reflect architectural requirements and specific test restrictions in the test data's structure and content. Data modeling is an activity by which test data is defined and generated.

Constraints are directives for the test generation. Constraints have three different sources. Type constraints are declared in the context of a struct, and are used to impose constraints on the values generated for the fields in a struct. Role constraints are specified by the hierarchy that links the generated instance to the global structs in the system. Generation point constraints can also be specified. All three types of constraints are used for each instance generation. Thus, each instance can be generated using different constraints.

A constraint can be used to restrict the possible values generated for fields in a specific run of a test. The restriction can narrow down the choice to a single value, or to a range of possible values. All constraints specified for a single field are applied.

It is known in the prior art to use parameter settings to constrain the test generator. However, the invention uses declarative constraints to constrain the functional scope of a verification test generated by the test generator.

Generation is executed in a recursive, depth first order. In each struct generated, the fields are typically generated according to the order in which they were declared in the struct. Appendix H describes the constraints and generation according to one embodiment of the invention.

Appendix I describes the supported file operations supported according to one embodiment of the invention.

Byte arrays are used to hold binary data having no internal structure. Appendix J describes byte arrays according to one embodiment of the invention.

In e, a string is a sequence of ASCII characters, terminated with a null character. Specman has a predefined type string. String variables and string fields can be declared by the user. Appendix K describes the structure and use of strings according to one embodiment of the invention.

Appendix L describes arithmetic routines supported in one embodiment of the invention.

The invention can also supply convenience routines in the e language. Appendix M describes convenience routines according to one embodiment of the invention.

Scripts are used to provide a syntax for describing sequences of different categories. Action scripts describe sequences of time-related activities. Data scripts describe sequences of data objects.

A script is a struct that includes a method into which the appropriate sequence can be inserted. This method is referred to as the script body. Scripts can also include fields, constraints, conditional definitions, methods, temporal assertions, state machines, and repetition actions.

Action scripts are used to model activities that span a simulation time. Appendix N describes scripts according to one embodiment of the invention.

Events represent significant occurrences within a DUT. A user can define an event, and can specify a situation that will cause the event to be issued, or logged. Events can be logged from any method. Checking can also be performed within events.

Events are defined in event statements. Appendix O describes events according to one embodiment of the invention.

The Specman has a basic clock that serves as the default clock for all script and time-related actions. The user can also define and use clocks in scripts. Specman also includes a field that stores the current time, according to the Specman. This field can be incremented by a method that is called by a Verilog or VHDL simulator. This method also updates the states of all user-defined clocks. Appendix P describes clocks according to one embodiment of the invention.

A cover statement is used to define a coverage point. Coverage points are used in an examination of the distribution of test result values. Any number of such cover statements can be included in a Specman e module. Appendix Q describes cover statements and coverage according to one embodiment of the invention.

Specman permits the user to define macros, such as new commands, actions, expressions, or any other syntactic element. Appendix R describes macros according to one embodiment of the invention.

The user can access commands of supported operating system from Specman. Appendix S describes the interface to the operating system according to one embodiment of the invention.

Appendix T describes miscellaneous statements supported by one embodiment of the invention.

The invention supports a set of commands for modifying the interactive mode parameters, and for performing such activities as compiling files in the verification-specific object-oriented programming language, launching tests, and browsing data. A user can define new commands to extend the set of predefined commands. In the Specman embodiment, commands are constructs defined in the e language.

Any predefined commands can be executed by being typed at the command prompt. A command file can be used to execute a sequence of commands.

All actions, other than time-consuming actions, can be typed at the command prompt. Time-consuming actions can appear only in the body of a script.

When the GUI is invoked, the user enters an interactive session with the invention. In the Specman embodiment, the user can pass commands to the Specview (GUI) by:

pressing buttons or menu options;

typing commands at the command prompt; and using a text editor to prepare a list of commands in a command file, and executing the commands in batch mode.

Appendix U describes the commands supported in one embodiment of the invention.

Compilation enables users to run special extensions faster than loaded code. In the Specman embodiment, compilation occurs directly under a UNIX shell, and outside the Specman environment. Compiled applications offer significant benefits, including:

faster execution time;

there is no need to supply source files with the application; and simpler execution.

However, compiled applications are also more difficult to debug. Appendix V describes compilation according to one embodiment of the invention.

The Specman embodiment is used to stimulate and check a model written in a hardware design language. The model of the DUT is preferably written in an HDL, such as Verilog or VHDL. The stubs for stimulating the DUT and checking it are written in the e language. The Specman compiles the e code, while the simulator compiles the DUT model. Customized versions of Specman and Verilog are linked to allow concurrent simulation to occur, with the ability to pass data between the two tools. This work mode is referred to as co-simulation.

Automatic Corner Case Generation.

Currently, if it is desired to reach corners of the design, it is necessary to request them explicitly via "choose" constraints (especially using the "select" construct). This is easy to do in Specman, but still needs manual work.

The idea of the corner searcher is to take any existing test, and search for its own corners. For example, suppose there is a CPU test which concentrates just on ALU operations. Thus, on the instruction-kind axis, this test has already requested a corner. For all other axis, though, the choice is random. It may get to a two-axis or three-axis corner eventually (and it certainly will if another constraint is added that specifies, e.g. that the addresses should be all-high, or all-low), but it would be an improvement if the corner was reached automatically. This is what the corner-searcher does automatically. Note that it is not necessarily desirable that the corner searcher always work, otherwise average cases cannot be obtained. The invention provides a way to specify to Specman what percentage of all test runs should run in corner-case mode (see discussion of meta-control below).

What Specman does in corner-case mode.

The effect of running a test in corner-case mode is that some of the random values that Specman choose during generation of this test are drawn using some heuristic, rather than drawn from a flat distribution. This all comes in addition to the user's "keep" and "choose" constraints.

The following are examples of the possible heuristics:

Use the highest value for each choice;

Use the lowest value for each choice;

Use a jumping policy (randomly choose highest or lowers value for each choice);

As with he preceding heuristics, but for just one particular field, or for a subset of all existing fields;

Stay with the value chosen for a field for some random sequence of choices, then move to the next random value. This can be done for one particular field, or for a subset of all existing fields. It can also be combined with the first three heuristics above;

The length of the sequence is also randomly generated, and may be very large, in which case the first choice of that field shall stick to it for the duration of the test. This may help to find bugs that only happen, e.g. if all packets are the same size (or all packets are of size eight exactly);

As with the fifth heuristic above, but do that only for consecutive items in a list (not just any occurrence of this field);

As above, but instead of saying "top" or "bottom" value, do something such as "edges" (all values that are at the edge of legality), with possibly some values close by;

(In pgen3 only) In a certain percent of the cases, cause Specman to change the order of evaluation (similar to putting a "choose" constraint, even with a flat distribution, on that field). For instance, if there is a struct with {x: int; y: int; z: bool fields x, y and z appear in that order, and there is a constraint:

keep x==y=>z==TRUE;

then normally z is never true, because x and y are chosen first. If Z is chosen to be true, or just said that it should be evaluated first (if possible, and in this case it is possible), then there are many interesting cases.

Note that this heuristic cause a more "fair" distribution of values;

As with all of the above, but ignore some of the user's "choose" constraints; and As with all of the above, but give higher percents to cases which are holes in the coverage file, according to some.

Controlling corner-case mode.

To control the corner-case machinery, a flexible mechanism is required so that:

For the naive user, there should be a good default;

The user (or the architecture developer) should have a flexible way to experiment with the various architectures;

The list of heuristics should be user-extensible; and

Controlling probabilities (of using the various heuristics) should be done in the same way one controls the probabilities of any Specman field.

To answer all these needs, the corner-case machinery is controlled using meta-generation, i.e. generating fields (via the usual "gen" action) whose values determine which heuristic is used in any specific case. Thus, in global there is a struct referred to as corner_case_control, which contains various global fields controlling the corner case machinery.

In particular, one global field is:

corner_case_mode: bool; When TRUE, this test is a corner-case test. This field is generated once per test, before any other generation.

choose corner_case_mode==select {25: TRUE; 75: FALSE}; 25% of all tests run in corner-case mode (changeable by user).

Further, in each seed domain (corresponding to "each field name which is to be randomized"), there is a field of type corner_case_struct (NULL when corner_case_mode is FALSE), which contains, for example a boolean field for each heuristic. Whenever a new seed_domain is created, if the system is in corner_case_mode, then a new corner_case_struct is generated randomly and attached to that seed domain. All subsequent random-value-generation using that seed domain use the heuristic fields in its corner_case_struct.

Specman comes with default distributions for the various fields in corner_case_control and corner_case_struct, but the user can extend those structs and change the defaults (using ordinary choose and keep constraints).

Combining multiple tests together.

Another powerful feature, which may be implemented in conjunction with the above, is the ability to specify several "background tests" (a list of .e files). In this case, Specman tries to load randomly some of these tests in addition to the specified test (maybe only in corner_case_mode). Note that this could cause contradictions, but not often, and would result in further corner cases being found.

The relation of the above to automatic filling of coverage holes.

Filling coverage holes (of the simple kind, on input fields) is preferably performed as follows:

There is a new command:

cover fill <wildcard-cover-names> <new-test-name>

For instance:

cover fill*filler.e

This create a new .e file called "filler.e", which contains "choose" requests which aim to fill the holes in all currently-defined cover points (thus the"*") Note that filler.e is a regular .e file. Thus, one can look at it and edit it at will. Note further that it may contain choose constraints for fields which are not generated. These choose constraints are ignored. Finally, filler.e can be loaded as a background test as described above.

The e language supports different dialects for the Verilog and VHDL hardware modeling languages. Appendix W describes Verilog and VHDL simulation according to one embodiment of the invention. Appendix X is an exemplary language syntax tree of an apparatus for test generation according to one embodiment the invention.

The invention supports High-Level Verification Automation (HLVA) facilities, such as the ability to split and layer architecture and test files. Thus, the invention can reuse both verification environments and test suites. Such recycling can reduce the time expended in verification and therefore increase productivity.

The invention can be used to check a user's PCI bus implementation. For example, the invention can be integrated with a user's testbench for sending, receiving, and reporting PCI transactions The invention can generate directed random transactions under user direction and issue such transactions in compliance with PCI local bus specifications.

The presently preferred embodiment of the invention is implemented as a computer software application. However, alternative embodiments can be implemented as a software/hardware component in a computer system, for example, an insertable board, or an integrated circuit having embedded software.

In addition to integrated circuits, the invention is applicable to all of the following domains:

The verification of any electronic system, e.g. in the form of a board or a box.

The verification of any system consisting of hardware and embedded software.

The verification of embedded software by itself.

The verification of complex systems consisting of hardware, software, and possibly people. Examples are airspace control systems, petrochemical control systems, industrial control systems, medical systems, and military control systems.

The verification of pure software systems, e.g. client-server software, GUI-based software, and compilers.

In each of these domains, the invention can be used to verify either a simulation of the running system, or the actual system.

When using the invention to verify these other domains, the primary element that has to be adapted for every domain is the actual interface between the invention and the system or its simulation. For each such domain, one must find or develop an interface which can be used to feed inputs into the DUT and receive results.

Thus, rather than using an HDL simulator's API, one would use e.g. the custom IO interfaces of the relevant system, or some relevant simulator's API.

One skilled in the art will readily be able to construct the hardware and software required for the invention using well-known programming techniques and equipment.

Accordingly, the invention should only be limited by the claims included below.

What is claimed is:

1. An apparatus for functional verification of a device design, comprising:

a test generator module for constraint based random test generation for automatically creating a verification test for said device; and a checking module for checking the data accuracy of said test when performed on said device;

wherein said design can be verified.

2. The apparatus of claim 1, wherein said device is a simulation of any module, chip, and system.

3. The apparatus of claim 1, further comprising:

an interactive debugging module for displaying data events and the interrelations of said data events, and for permitting modifications to said device design.

4. The apparatus of claim 1, further comprising a reporting module for generating reports regarding said test and said device.

5. The apparatus of claim 4, further comprising a coverage module for showing the distribution of occurrences in a multi-dimensional space thus providing the user with information to locate gaps in the verification process.

6. The apparatus of claim 1, wherein said test generator automatically creates a test from a functional description.

7. The apparatus of claim 1, wherein said apparatus is operable to perform any combination of deterministic tests, random tests, dynamic tests, and static tests.

8. An apparatus for functional verification of a device design, comprising:

a test generator module for constraint based random test generation for automatically creating a verification test for said device, said test generator dynamically creating said test in response to a current state of said device; and a checking module for checking the data accuracy of said test when performed on said device;

wherein said design can be verified.

9. An apparatus for functional verification of a device design, comprising:

a test generator module for constraint based random test generation for automatically creating a verification test for said device;

a checking module for checking the data accuracy of said test when performed on said device;

wherein said design can be verified; and a verified specific object-orientated programming language for constructing and customizing said verification tests.

10. The apparatus of claim 9, wherein said verification specific object-orientated programming language is extensible.

* * * * *